United States Patent
Gründl et al.

(10) Patent No.: US 7,622,985 B2
(45) Date of Patent: Nov. 24, 2009

(54) ACTIVE COMPENSATION FILTER

(75) Inventors: Andreas Gründl, Starnberg (DE);
Bernhard Hoffmann, Starnberg (DE);
Alexander Kleimaier, Germering (DE)

(73) Assignee: Compact Dynamics GmbH, Starnberg (DE)

( * ) Notice: Subject to any disclaimer, the term of this patent is extended or adjusted under 35 U.S.C. 154(b) by 0 days.

(21) Appl. No.: 12/117,428

(22) Filed: May 8, 2008

(65) Prior Publication Data

US 2008/0278229 A1 Nov. 13, 2008

(30) Foreign Application Priority Data

May 10, 2007 (DE) ...................... 10 2007 021 978

(51) Int. Cl.
*H03B 1/04* (2006.01)

(52) U.S. Cl. ........................ 327/559; 327/552; 330/303

(58) Field of Classification Search ................ 327/559, 327/552; 330/79, 303
See application file for complete search history.

(56) References Cited

U.S. PATENT DOCUMENTS 3,445,781 A * 5/1969 Wolcott ...................... 330/104
3,628,057 A 12/1971 Mueller
4,253,070 A * 2/1981 Carlsen, II ................... 330/260
4,667,279 A 5/1987 Maier
5,668,464 A 9/1997 Krein et al.
6,566,947 B2 * 5/2003 Gorcea ......................... 330/75
2002/0121930 A1* 9/2002 Gorcea ......................... 330/75
2009/0115564 A1* 5/2009 Minteer ................... 336/84 M

FOREIGN PATENT DOCUMENTS

EP 0 877 467 A1 11/1998

* cited by examiner

*Primary Examiner*—Lincoln Donovan
*Assistant Examiner*—Ryan C Jager

(57) ABSTRACT

An active compensation filter for the application in the electric power supply in a land vehicle, which comprises a high-pass filter which is to be coupled with a supply voltage line which carries a supply voltage, in order to detect frequency and amplitude of interference voltage components of the supply voltage. A signal amplifier which is connected in series with the high-pass filter amplifies the detected interference voltage components and supplies them to a coupling element as output signals, which is connected in series with the signal amplifier and comprises a primary side and a secondary side. The primary side is fed with the output signals of the signal amplifier and the secondary side is looped into the supply voltage line.

12 Claims, 3 Drawing Sheets

ACTIVE COMPENSATION FILTER

RELATED APPLICATIONS

Figure 1:
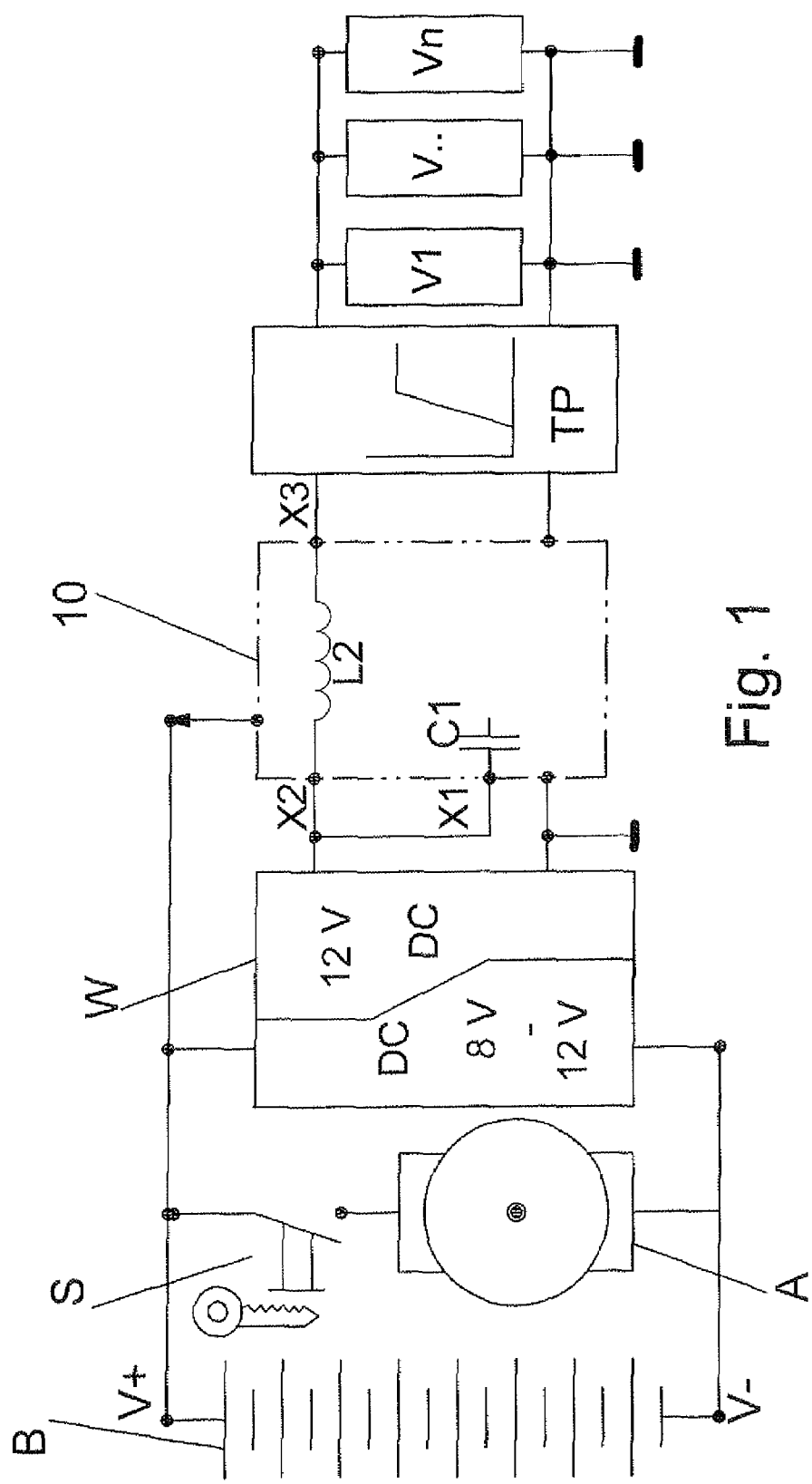

The present invention claims priority from DE 10 2007 021 978.6, filed May 10, 2008.

INTRODUCTION

In the following, an active compensation filter will be described which, for example, lends itself for the application in the electric power supply of a land vehicle. This may involve a power supply (accumulator in a vehicle electric system) for vehicles, which is connected in series with one or several central or distributed d.c. voltage/d.c. voltage converters (DC/DC converters) as a voltage stabiliser.

BACKGROUND

Due to the ever increasing electrification of motor vehicles, the demand for electric energy in motor vehicles is increasing considerably. In addition, the power consumers in motor vehicles impose increasing requirements to the quality of the power supply (voltage stability and low interference signal susceptibility). This does not only apply to "comfort consumers" (audio system, navigation system, air conditioning system, etc.), but in particular to function or safety relevant consumers (onboard computer, brake control system, fuel injection control system, etc.) of the motor vehicle. In the case of occurring load peaks, for example, in particular during the starting operation of the motor vehicle, this may have the effect that consumers which have already been activated do no longer function properly or are subjected to interference signals via the power supply because of the load applied by the starter. While, in the case of the audio system, this may be experienced as "merely" annoying, critical functional abnormalities may occur in other function or safety relevant consumers (onboard computer or the like). Such interference effects are particularly noticeable in the start/stop mode of motor vehicles, which for fuel economy reasons is increasingly favoured.

Another aspect is the increasing requirement to the electromagnetic compatibility (EMC) of the motor vehicles. Conventional passive filter need a comparatively large installation space. Moreover, their efficiency is limited.

The active compensation filter which will be described below requires a small installation space, has a minimal series resistance, and may replace conventional passive filters. It is thus very well suited for, e. g. electrical equipment in the automotive field.

U.S. Pat. No. 4,667,279 relates to noise rejection without significant dissipation of energy. The noise generated within a DC power supply is reduced by coupling a high pass filter to the output circuit of the supply. This produces a signal corresponding to the noise. This signal is applied to the primary winding of a transformer via an amplifier. The secondary winding is connected to the output circuit so as to tend to cancel any noise therein. The input of the high pass filter is connected across the output circuit, and the secondary winding of the transformer is connected in series with it so as to be traversed by load current.

This provides for optimized for operation in a constant voltage mode. An amplifier acts as a voltage amplifier and the phasing is such that the voltage appearing across the secondary winding is out of phase with the noise voltage so that cancellation can occur.

The high pass filter is connected to either side of the secondary winding. The input of the high pass filter is connected across a current sensing resistor through which the load current passes, and the secondary winding is connected across the output circuit so as to be in shunt with the load. The amplifier acts to vary the current in the secondary circuit in such phase with respect to the noise current flowing toward the load as to reduce the noise current from flowing in the load.

In order that the changes in noise cancellation voltage or current thus introduced in the output circuit may have the correct amplitude, the gain of the amplifier is set at an appropriate value. If the cancellation voltage or current do not have the proper phase, a phase compensation circuit is coupled to the amplifier.

U.S. Pat. No. 3,628,057 relates to a corrective circuit for use in an active band-pass filter that provides improved cancelling out of the power source signals that pass through the stop-band notch filter. Reference and orthogonal phase detectors are combined which each generate an error signal indicating the magnitude and polarity of the in phase (reference) and 90° out of phase (orthogonal) components of the power source signals passing through the stop-band notch filter. A signal generator connected to the power line produces plus and minus reference signals and plus and minus orthogonal signals. A reference and an orthogonal modulator are each connected to receive and use the respective reference and orthogonal error signals to amplitude modulate the signals from the signal generator to construct a feedback signal which is equal to and 180° out of phase with the power source signal passing through the stop-band notch filter.

European Patent Application 0 877 467 A1 relates to a device which reduces the ripple component of the signal fed to a load by a power converter via a feed line. The device has one inductor and an acquisition means for acquiring the signal fed to the load. It further has means a filter element for extracting the ripple component from the signal. Connected to the inductor are inductor feed means for generating an electric signal fed to the inductor. The inductor feed means generate the electric signal automatically varying this signal in relation to the value of the ripple component measured in the feed line. This reduces the ripple component in the signal fed to the load.

The inductor is of the coupled type with its primary circuit being connected to the load and its secondary circuit being connected to a second power amplifier generating the electric signal arranged to reduce the ripple component, and the common node being connected to the power converter. The acquisition means, the extraction means and the inductor feed means are connected into a feedback loop.

U.S. Pat. No. 5,668,464 refers to a parallel active filter which is incorporated into a switching power converter. The filter reduces ripple by injecting a cancellation current into the electrical load. The cancellation current is equal and opposite to an estimated ripple current. The estimated ripple current is produced by integration of an inductor voltage within the converter circuit. An adaptive tuning circuit is incorporated into the filter. The filter uses feedforward of an internal converter voltage to determine the necessary ripple compensation current.

SHORT SUMMARY

An active compensation filter has a high-pass filter which is to be coupled with a supply voltage line which carries a supply voltage, in order to detect the frequency and amplitude of interference voltage components of the supply voltage. The active compensation filter also comprises a signal amplifier which is connected in series with the high-pass filter, which amplifies the interference voltage components detected in the supply voltage and feed them to a coupling element as output signals. The coupling element is connected in series with the signal amplifier and has a primary side and a secondary side. The primary side is fed the output signals of the signal amplifier and the secondary side is to be looped into the supply voltage line.

The described active compensation filter is based on the concept to detect interference voltage components which are present in the supply voltage and may be of varying frequency and amplitude and to impress/feed same again in phase opposition to the supply voltage as completely as possible so that the interference voltage components are cancelled at least approximately. The detection of the frequency and amplitude of the interference voltage components is described herein as to be accomplished by a high-pass filter. This high-pass filter may also be part of a band-pass filter.

ALTERNATIVES AND EMBODIMENTS

In the active compensation filter, the high-pass filter may be a single stage or multistage high-pass filter of a first or higher order, which has a cut-off frequency of approximately half the fundamental frequency of the interference voltage components. In a simple configuration, the high-pass filter is a capacitor-resistor-quadripole circuit which detects interfering AC components which are present in the supply voltage and feeds them to the signal amplifier. Typically, a DC/DC converter which converts an input voltage of approx. 8 V to approx. 14 V to a constant output voltage of approx. 12 V may have an operating frequency of approx. 175 kHz. From this it follows that the supply voltage from the DC/DC converter is superposed by interference signals/interference voltage components of approx. 175 kHz and their harmonics. In this case, the high-pass filter has a cut-off frequency of approx. one fourth of to approx. half the clock frequency of the DC/DC converter. The active compensation filter is able —as described above—to "smooth" the supply voltage at the output side of the DC/DC converter, which is provided by same. It is, however, also considered to employ the active compensation filter at other sites of an onboard DC voltage supply (e. g. at the input side of the DC/DC converters) in order to adjust the controlled or uncontrolled supply voltage of interference signals/interference voltage components to the greatest possible extent.

The coupling element may have a transformer with at least two galvanically separated, magnetically coupled windings. The galvanically separated, magnetically coupled windings form the primary side or the secondary side, respectively of the coupling element.

For the detection of interference voltage components in the supply voltage and to impress same in phase opposition (i. e. inverted) on the supply voltage, there are several possibilities. One variant provides for inverting the amplitude of the output signals of the signal amplifier relative to the detected interference voltage components. In this case, the primary and secondary side of the coupling transformer have the same sense of winding.

Alternatively, the amplitudes of the output signals of the signal amplifier are not inverted relative to the interference voltage components detected in the supply voltage. In this case, the primary side of the coupling transformer, which is fed by the signal amplifier, has a winding direction opposite to that of the secondary side.

The secondary winding of the coupling transformer has a low number of turns which is below 50. Thereby a minimum voltage drop/series resistance of the supply voltage in the active filter is achieved. The secondary side of the coupling transformer may have one single turn. In a variant, the supply voltage line is routed only through a transformer core of the coupling transformer or past the primary side of the coupling transformer enclosing the magnetic flux. The interference voltage components are thereby impressed on the supply voltage in phase opposition.

Furthermore, the active compensation filter may have a low-pass filter which is connected in series with the secondary side of the coupling transformer in the supply voltage line and has a cut-off frequency of approx. five to fifty times the fundamental frequency of the interference voltage components. In the above mentioned case, where the active filter is connected in series with a DC/DC converter which has an operating frequency of approx. 175 kHz, a cut-off frequency of approx. 1 MHz or above is obtained for the high-pass filter.

The signal amplifier of the active compensation filter may be a single stage or multistage inverting or non-inverting alternating voltage signal amplifier. The total amplification of the signal amplifier has to be dimensioned in such a manner that its amount corresponds to the ratio of the number of turns of the primary side to the number of turns of the secondary side of the coupling transformer. At the same time, an adequate transmission bandwidth of the signal amplifier has to be ensured, so that the interference voltage components are impressed on the supply voltage by the coupling transformer as completely as possible (but in phase opposition).

The coupling transformer may also be provided with a tertiary winding hat and the signal amplifier with a negative feedback path in which the tertiary winding is disposed, and which leads from an output of the signal amplifier to an input of the signal amplifier. In this manner, non-linearities of the coupling transformer or of the signal amplifier, which are caused, for example, by temperature drift, magnetic loss, etc. may easily be compensated.

Finally, in addition or in lieu of taping the interference voltage components upstream of the secondary winding of the coupling transformer, also a tap for interference voltage components downstream of the secondary winding of the coupling transformer in a negative feedback path may lead to an input of the signal amplifier. This allows the inverted impression of the interference voltage components not only in a controlled manner but within a regulation scheme. The interference voltage component which is tapped at the secondary winding of the coupling transformer may also be evaluated within an adaptive control scheme. In this manner, the interference voltage components are eliminated from the supply voltage particularly precisely.

In addition to impressing the phase opposition/inverted interference voltage components which may also vary with respect to frequency and amplitude on the supply voltage in the coupling transformer, a direct current component may also be impressed whose polarity is directed opposite to the supply voltage. This prevents or at least weakens the tendency of the coupling transformer to go into a magnetic saturation.

Further characteristics, properties, advantages, and possible modifications of this active compensation filter will be explained in more detail in the following description with reference to the accompanying drawings.

SHORT DESCRIPTION OF THE FIGURES

FIG. 1 schematically shows an overall circuit diagram of a power supply of a motor vehicle with several consumers, into which an active compensation filter is integrated.

Figure 2:
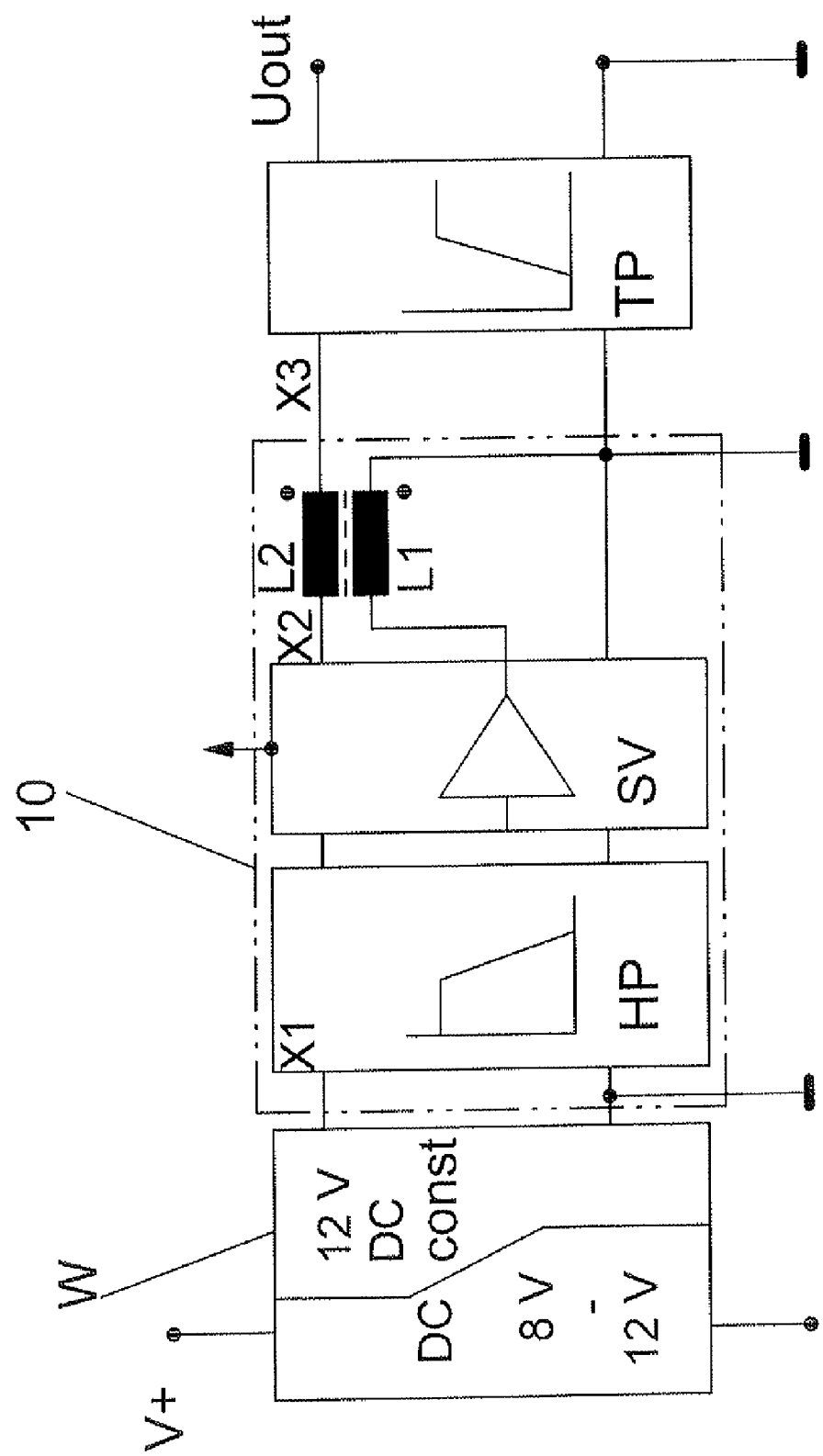

FIG. 2 schematically shows a DC/DC converter which is connected in series with an active compensation filter illustrated in the form of a block diagram.

Figure 3:
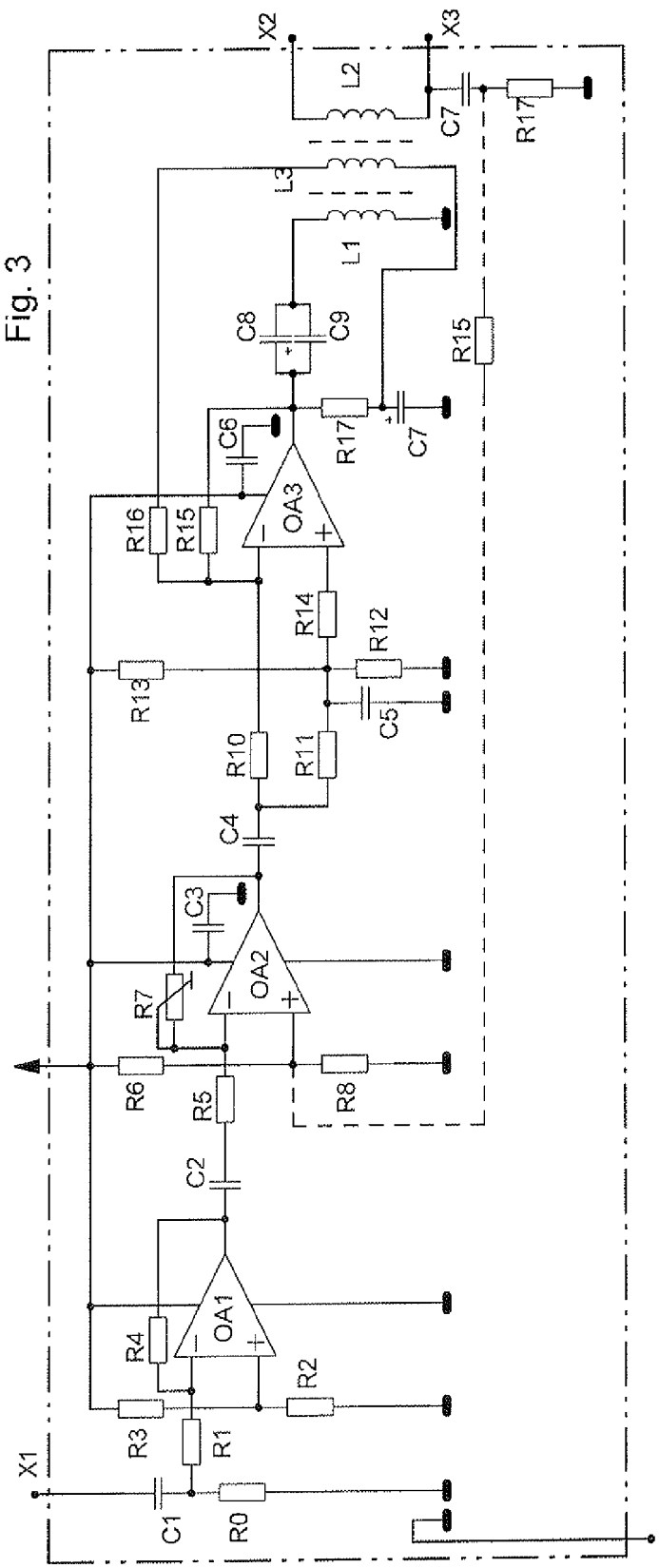

FIG. 3 schematically shows a circuit diagram of an active compensation filter from FIG. 1 or 2, respectively.

Identical or similar components or assemblies with identical or similar functions are identified with the same reference numerals in the figures.

DETAILED DESCRIPTION OF THE FIGURES

FIG. 1 shows a portion of the electric system of a motor vehicle. A battery B, more precisely an accumulator, may put a combustion engine (not shown) into operation upon the actuation of a key switch S, the ignition key, via a starter A. The battery B also feeds a DC/DC converter W which provides stabilised 12 V from the uncontrolled voltage of the battery B from 8 V to 14 V for a plurality of electric consumers V1 . . . Vn (audio system, navigation system, air conditioning system, etc., or onboard computer, brake control system, fuel injection control system, etc.). In place of a single central DC/DC converter W for several electric consumers of the motor vehicle it is also possible to provide a plurality of decentralised DC/DC converters W for each or some of the plurality of the consumers V1 . . . Vn. An active compensation filter 10 is connected between the/each DC/DC converter(s) W and the consumers V1 . . . Vn. The active compensation filter 10 may additionally also be connected in the supply line between the battery B and the/each DC/DC converter(s) W.

In FIG. 2, the active compensation filter 10 is shown as a detailed block diagram compared to FIG. 1, with the filter 10 being connected in series with the DC/DC converter W from FIG. 1. The active compensation filter 10 has a high-pass filter HP which is to be coupled with a supply voltage line from the DC/DC converter W. This supply voltage line carries/supplies an essentially constant supply voltage is, however, superposed by interference voltage components. The high-pass filter HP serves to detect frequency and amplitude of interference voltage components of the supply voltage—DC voltage-free. The high-pass filter HP may also be part of a band-pass filter, provided the frequency components of the interference voltage components are merely situated within a determinably frequency band. The active compensation filter 10 has a signal amplifier SV which is connected in series with the high-pass filter, which amplifies detected interference voltage components and feeds them as output signals to a coupling transformer L1/L2. The coupling transformer L1/L2 is connected in series with the signal amplifier SV. A primary side L1 is fed by an output of the signal amplifier SV. A secondary side L2 of the coupling transformer is looped into the supply voltage line from the DC/DC converter W.

FIG. 3 is a detailed illustration of an embodiment of the active compensation filter 10. The compensation filter 10 is connected with the supply voltage line from the DC/DC converter W at a terminal point X1. A CR series connection with a capacitor C1 and a resistor R0, which is connected with the supply voltage line leads from the terminal point X1 to ground. An input resistor R1 of a first operation amplifier OA1 is connected at the connection point between the capacitor C1 and the resistor R0. The input resistor R1 leads to the inverting input (−) of the first operation amplifier OA1. A series connection of two identical resistors R2, R3 between ground and the positive supply voltage serves to create a virtual zero, in that half the positive supply voltage is applied to the non inverting input (+) of the first operation amplifier OA1. A negative feedback resistor R4 is arranged between the output of the first operation amplifier OA1 and its inverting input (−), which together with the input resistor R1 establishes the amplification ratio of the first operation amplifier OA1.

The output of the first operation amplifier OA1 is connected with the inverting input (−) of a second operation amplifier OA2 via a CR series connection with a capacitor C2 for separating the DC voltage component of the output signal and an input resistor R5. A series connection with two identical resistors R6, R8 between ground and the positive supply voltage serves to create a virtual zero, in that half the positive supply voltage is applied to the non inverting input (+) of the second operation amplifier OA2. Between the output of the second operation amplifier OA2 and its inverting input (−) an adjustable feedback resistor R7 is arranged which together with the input resistor R5 establishes the amplification ratio of the second operation amplifier OA2. An interference-suppression capacitor C3 is provided for the second operation amplifier OA2 between ground and the positive supply voltage.

The output of the second operation amplifier OA2 is connected with the inverting input (−) of a third operation amplifier OA3 via a CR series connection comprising a capacitor C4 for separating the DC voltage component of the output signal and an input resistor R10.

A resistor R11 is provided in parallel with the input resistor R10, which together with a capacitor C5 leading to ground forms a low-pass filter. A series connection with two identical resistors R12, R13 between ground and the positive supply voltage serves to create a virtual zero, in that half the positive supply voltage is applied to the non inverting input (+) of the third operation amplifier OA3 via a resistor R14.

Between the output of the third operation amplifier OA3 and its inverting input (−) a negative feedback resistor R15 is arranged. In addition, a pair of capacitors C8, C9 connected in parallel leads from the output of the third operation amplifier OA3 for the separation of the DC component in the output signal to the primary side of the coupling transformer L1. The other terminal of this primary winding L1 is connected to ground.

A high-resistance resistor leads from the output of the third operation amplifier OA3 to a tertiary winding L3 of the coupling transformer. The other terminal of the tertiary winding L3 is connected with the inverting input (−) of the third operation amplifier OA3 via another negative feedback resistor R16. The negative feedback resistor R16 together with the input resistor R10 establishes the amplification ratio of the third operation amplifier OA3.

For stabilising the DC voltage component of the output signal, which serves to bias the tertiary winding L3 of the coupling transformer, a capacitor C7 is provided between ground and the infeed point into the tertiary winding L3 of the coupling transformer. In this manner, non-linearities of the coupling transformer will be compensated. The secondary winding L2 with its two terminals X2, X3 is disposed in the supply voltage line and impresses a signal on the voltage applied thereon which corresponds to the interference voltage signal characteristic applied to the input X1, but which is inverted. In the third operation amplifier OA3 an interference-suppression capacitor C6 is provided between ground and the positive supply voltage.

If the desired compensation effect is not achieved for all frequency domains of the interference signals, a capacitor C7 may additionally be provided at the terminal X3 of the secondary winding L2, which capacitively decouples occurring interference voltage signals and returns them into the non-inverting input (+) of the second operation amplifier OA2. The capacitor C7 together with a resistor R17 which is connected with ground form a high-pass filter. This high-pass filter may also be part of a bandpass filter.

In the present embodiment of the active compensation filter 10 the product of the gain values of all three operation amplifiers OA1, OA2 and OA3—by the adjustable resistor R7 at the second operation amplifier OA2—is set to the transformation ratio of the secondary winding L2 to the primary winding L1.

The invention claimed is:

1. An active compensation filter for the application in the electric power supply in a land vehicle, with the compensation filter comprising:
   a high-pass filter which is to coupled with a supply voltage line which carries a supply voltage in order to detect frequency and amplitude of interference voltage components of the supply voltage,
   a signal amplifier connected in series with the high-pass filter, which amplifies the detected interference voltage components and
   supplies them as output signals to a coupling element which is connected in series with the signal amplifier and comprises a primary side and a secondary side, with the primary side being fed with the output signals of the signal amplifier and the secondary side being looped into the supply voltage line, characterised in that
   the coupling element comprises a transformer with at least three galvanically separated, magnetically coupled turns, with
   a tertiary winding being provided in a negative feedback path of the signal amplifier, and with
   the negative feedback path leading from an output of the signal amplifier to an input of the signal amplifier wherein a tap for interference voltage components downstream of the secondary winding of the coupling transformer in a negative feedback path leads to an input of the signal amplifier.

2. The active filter according to claim 1, wherein the high-pass filter is a single stage or a multistage high-pass filter of the first or higher order.

3. The active filter according to one of claim 1, wherein the high-pass filter has cut-off frequency of approx. half the fundamental frequency of the interference voltage components.

4. The active filter according to claim 1, wherein the high-pass filter has cut-off frequency of approximately half to one fourth of the clock frequency of a DC/DC converter coupled to the supply voltage line to supply the supply voltage.

5. The active filter according to claim 1, wherein the output signals of the signal amplifier are inverted with respect to their amplitudes relative to the detected interference voltage components, and wherein the primary side and the secondary side of the coupling transformer have the same sense of winding.

6. The active filter according to claim 1, wherein the output signals of the signal amplifier are not inverted with respect to their amplitudes relative to the detected interference voltage components, and wherein the primary side of the coupling transformer has a sense of winding opposite to that of the secondary side.

7. The active filter according to claim 1, wherein the secondary side of the coupling transformer has a low number of turns, which is below 50.

8. The active filter according to claim 1, wherein the secondary side of the coupling transformer has a single turn.

9. The active filter according to claim 1, wherein a low-pass filter is connected in series with the coupling transformer in the supply voltage line.

10. The active filter according to claim 9, wherein the low-pass filter has a cut-off frequency of approx. five to fifty times the fundamental frequency of the interference voltage components.

11. The active filter according to claim 1, wherein the signal amplifier is a single stage or multistage inverting or non-inverting AC voltage signal amplifier.

12. The active filter according to claim 1, wherein a direct current component whose polarity is directed opposite to the supply voltage is impressed on the supply voltage.

* * * * *